(12) United States Patent
Pietambaram et al.

(10) Patent No.: US 11,164,818 B2
(45) Date of Patent: Nov. 2, 2021

(54) INORGANIC-BASED EMBEDDED-DIE LAYERS FOR MODULAR SEMICONDUCTIVE DEVICES

(71) Applicant: Intel Corporation, Santa Clara, CA (US)

(72) Inventors: Srinivas V. Pietambaram, Chandler, AZ (US); Tarek Ibrahim, Mesa, AZ (US); Kristof Darmawikarta, Chandler, AZ (US); Rahul N. Manepalli, Chandler, AZ (US); Debendra Mallik, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/363,698

(22) Filed: Mar. 25, 2019

(65) Prior Publication Data

US 2020/0312767 A1    Oct. 1, 2020

(51) Int. Cl.
| | |
|---|---|
| *H01L 23/538* | (2006.01) |
| *H01L 23/48* | (2006.01) |
| *H01L 23/498* | (2006.01) |
| *H01L 23/00* | (2006.01) |
| *H01L 25/065* | (2006.01) |

(52) U.S. Cl.
CPC ........ *H01L 23/5383* (2013.01); *H01L 23/481* (2013.01); *H01L 23/49822* (2013.01); *H01L 23/49894* (2013.01); *H01L 24/09* (2013.01); *H01L 25/0652* (2013.01)

(58) Field of Classification Search
None
See application file for complete search history.

(56) References Cited

U.S. PATENT DOCUMENTS

| | | | |
|---|---|---|---|
| 8,546,955 B1 * | 10/2013 | Wu ............... | H01L 25/0652 257/777 |
| 9,368,450 B1 | 6/2016 | Gu | |
| 2008/0301933 A1 * | 12/2008 | Miller ............... | H05K 1/117 29/830 |
| 2010/0298027 A1 * | 11/2010 | Yun ............... | H01Q 1/243 455/553.1 |
| 2011/0304999 A1 | 12/2011 | Yu | |
| 2013/0084653 A1 * | 4/2013 | Rubin ............... | H01L 21/266 438/3 |
| 2014/0299999 A1 * | 10/2014 | Hu ............... | H01L 24/19 257/774 |

(Continued)

FOREIGN PATENT DOCUMENTS

| | | |
|---|---|---|
| DE | 10 2014 003462 | 9/2015 |
| WO | WO 2018/125132 | 7/2018 |
| WO | WO 2020/005392 | 1/2020 |

OTHER PUBLICATIONS

Search Report for European Patent Application No. 20156743.5, dated Jul. 30, 2020, 6 pgs.

*Primary Examiner* — Jay C Chang
(74) *Attorney, Agent, or Firm* — Schwabe, Williamson & Wyatt, P.C.

(57) ABSTRACT

A glass substrate houses an embedded multi-die interconnect bridge that is part of a semiconductor device package. Through-glass vias communicate to a surface for mounting on a semiconductor package substrate.

19 Claims, 13 Drawing Sheets

(56) References Cited

U.S. PATENT DOCUMENTS

| | | | | |
|---|---|---|---|---|
| 2015/0162307 A1* | 6/2015 | Chen | ................ | H01L 21/56 |
| | | | | 257/712 |
| 2016/0302308 A1 | 10/2016 | Lee | | |
| 2018/0284186 A1* | 10/2018 | Chadha | ................ | H01L 25/18 |
| 2018/0350684 A1* | 12/2018 | Mandal | ................ | H01L 23/481 |
| 2019/0051633 A1* | 2/2019 | Bhagavat | ................ | H01L 24/19 |
| 2020/0111734 A1* | 4/2020 | Lin | ................ | H01L 24/81 |

\* cited by examiner

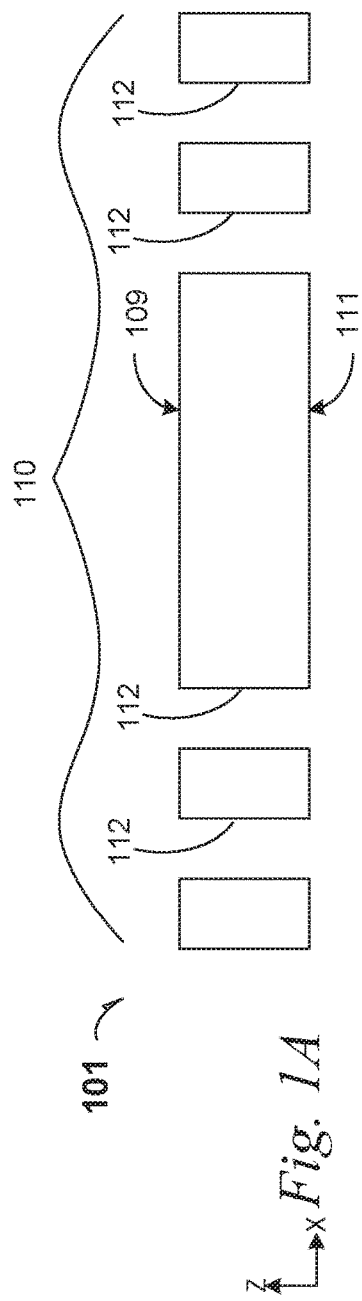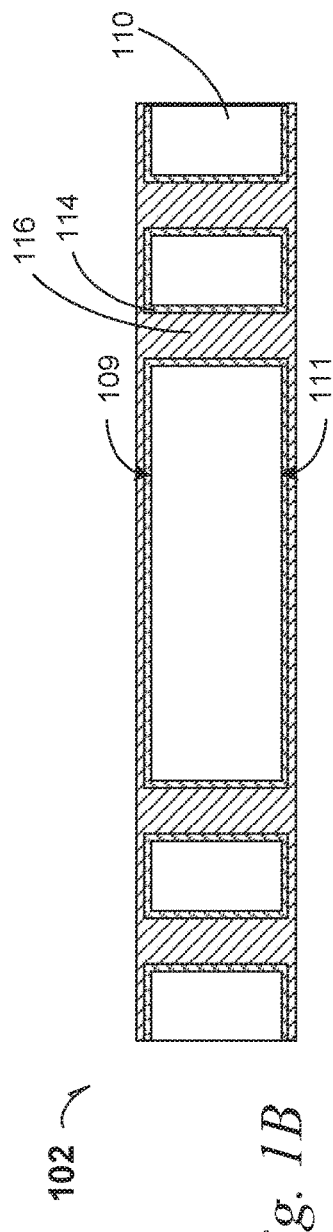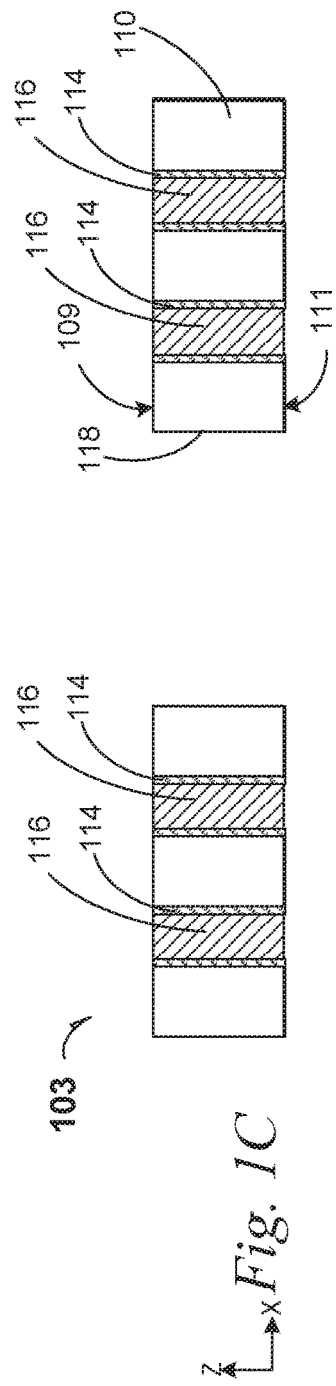

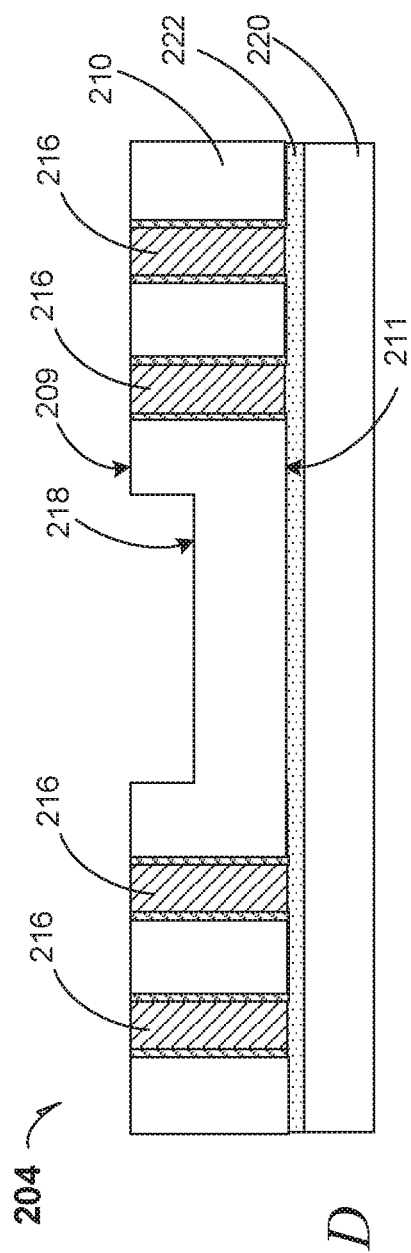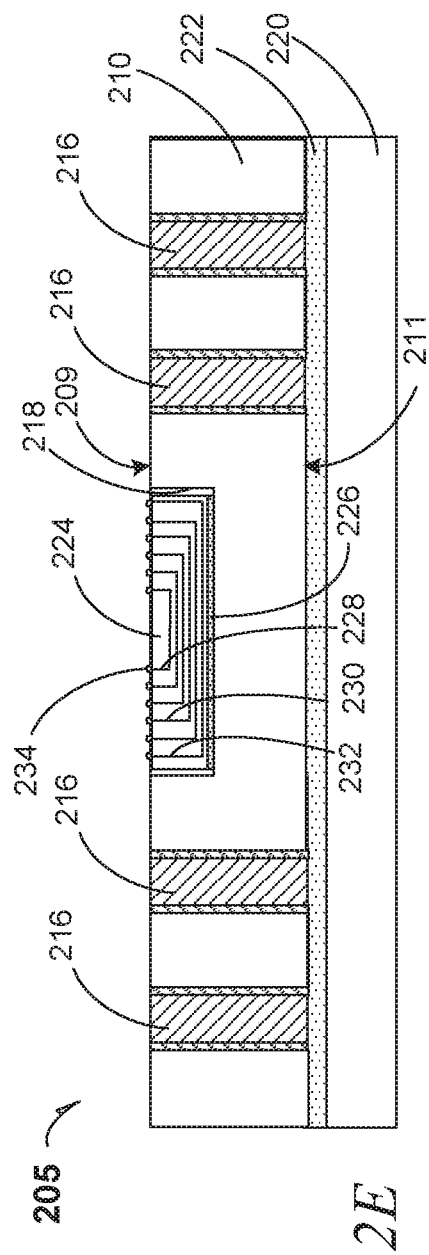

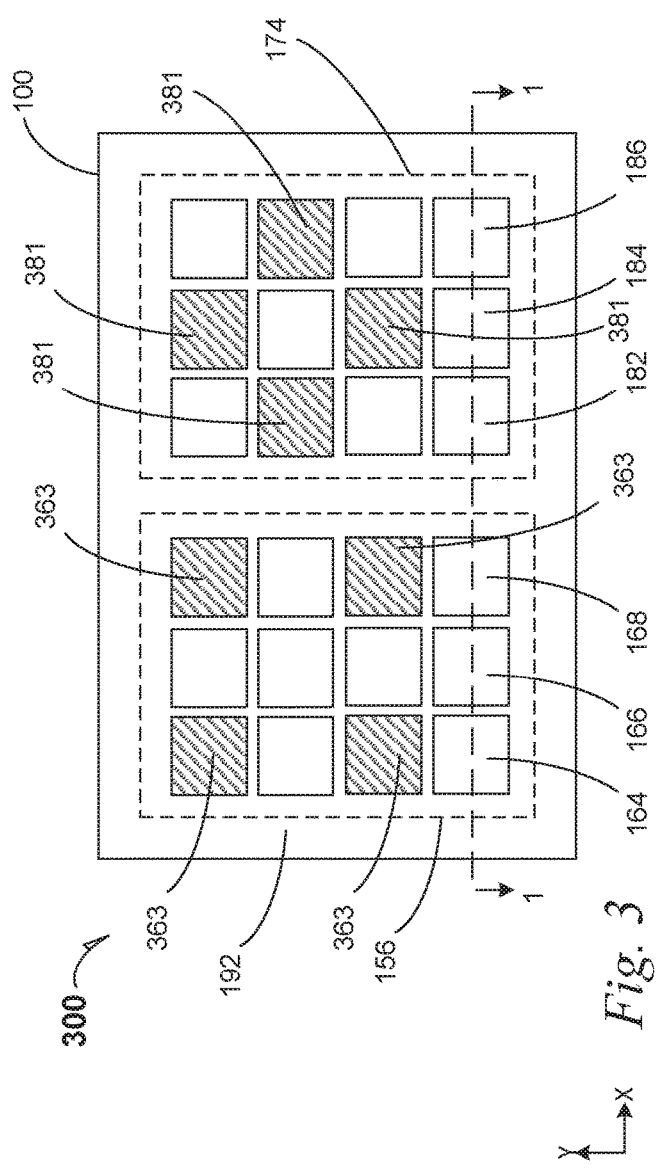
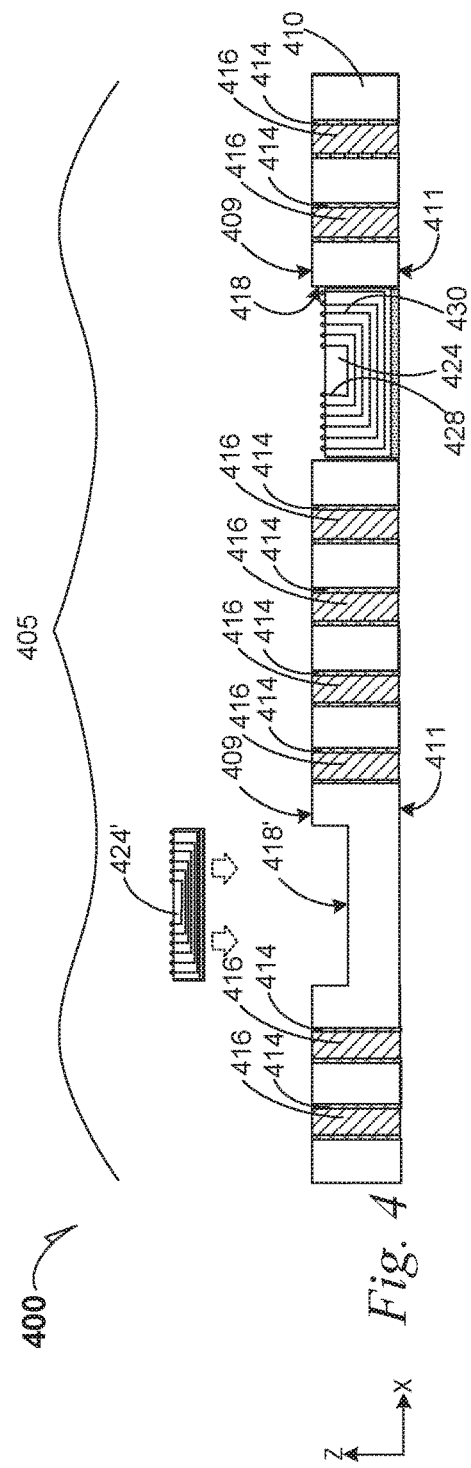

INORGANIC-BASED EMBEDDED-DIE LAYERS FOR MODULAR SEMICONDUCTIVE DEVICES

FIELD

This disclosure relates to embedded multi-chip interconnect bridges seated among inorganic layers for packaged semiconductor apparatus.

BACKGROUND

Semiconductive device miniaturization during die-tiling packaging includes challenges to manage bump-thickness variations during assembly.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of the semiconductor device package depicted in FIG. 1 during assembly according to an embodiment;

FIG. 1B is a cross-section elevation of the glass substrate depicted in FIG. 1A after further processing according to an embodiment;

FIG. 1C is a cross-section elevation of the glass substrate depicted in FIG. 1B after further processing according to an embodiment;

FIG. 2D is a cross-section elevation of the glass substrate depicted in FIG. 2C after further processing according to an embodiment;

FIG. 2E is a cross-section elevation of a semiconductor device package after further processing of the glass substrate depicted in FIG. 2D according to an embodiment;

FIG. 3 is a top plan of the modular die depicted in FIG. 1 according to an embodiment;

FIG. 4 is a cross-section elevation of a semiconductor device package during processing of a glass 410 according to an embodiment;

DETAILED DESCRIPTION

Silicon bridge embedded patches are surrounded by a glass substrate, in a useful depth, whether the depth is a through-hole in the glass or it is a recess. The glass substrates provide warpage mitigation. Fabrication includes placing a silicon bridge and a glass substrate that has a useful depth on a dimensionally stable glass carrier with a temporary release layer followed by a redistribution layer (RDL) build-up that includes a photo imageable solder resist near die level. At least two dice are coupled to the silicon bridge using thermal compression bonding techniques, after which the glass carrier is removed. In an embodiment, the glass is a soda lime glass (SLG). In an embodiment, the glass is a silicon dioxide glass. In an embodiment, the glass is an aluminosilicate material. In an embodiment, the glass an aluminosilicate material with an additive of potassium and magnesium and sodium. The glass material for the substrate and carrier can be chosen appropriately to minimize warpage during RDL processing and during assembly. Other inorganic materials may be used that exhibit glass-like responses to thermal loads.

Modular die embodiments, also known as die-disaggregation and die partitioning, is done to as it enables heterogeneous die integration, miniaturization of form factor and high performance with useful yield.

Figure 1:
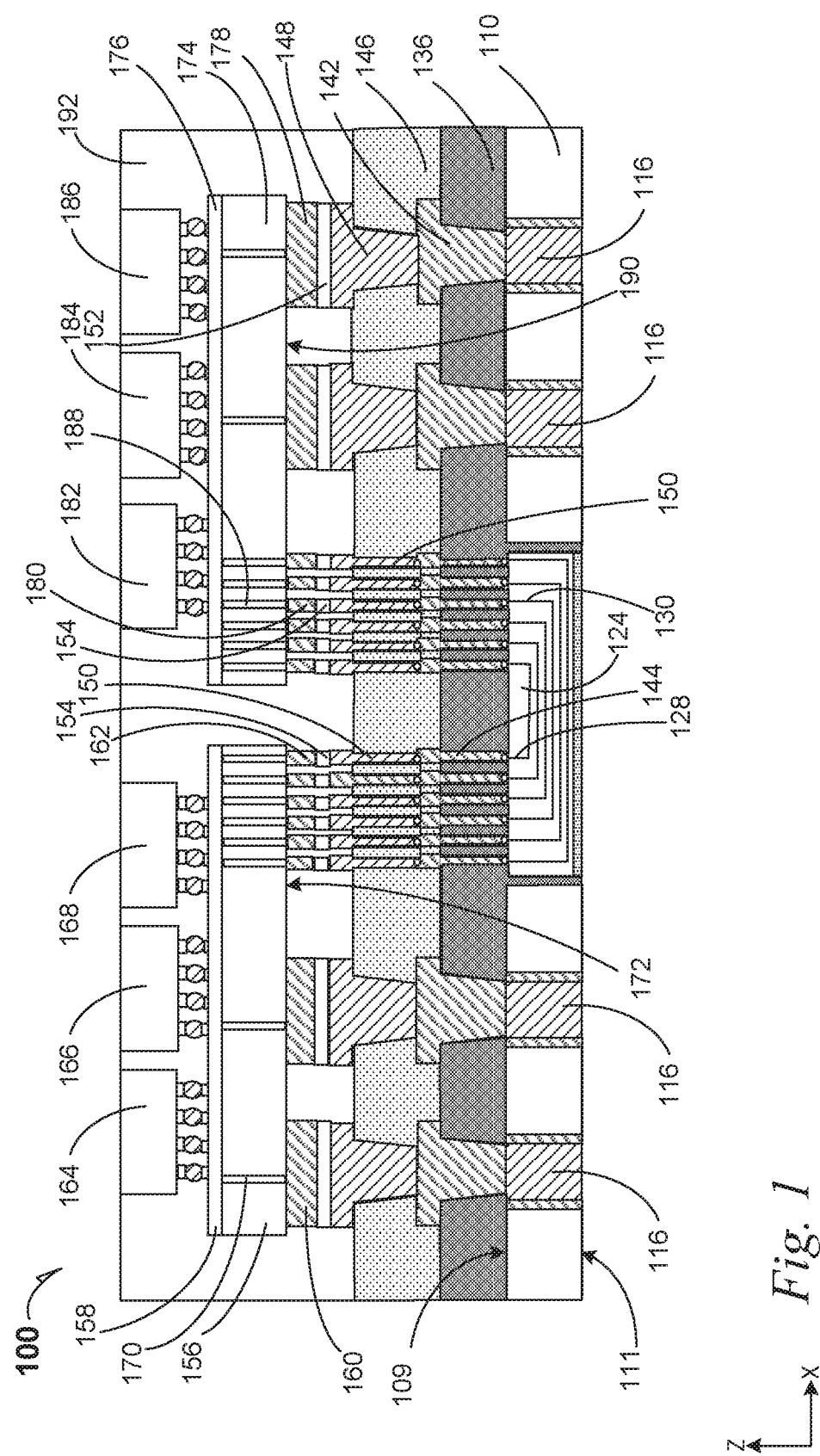
FIG. 1 is a cross-section elevation of a modular semiconductive device according to an embodiment.

FIG. 1 is a cross-section elevation of a modular semiconductive device 100 according to an embodiment. A "modular semiconductive device" may also be referred to as a disaggregated-die semiconductive device, or an embedded multi-die interconnect bridge (EMIB) disaggregated-die semiconductive device, or an EMIB modular-die system in package (EMIB SiP). Other designations may be useful.

A glass substrate 110 has an embedded multi-die interconnect bridge (EMIB) 124 in a through-hole 118 (see FIG. 1C) portion of the substrate 110. The EMIB 124 is embedded in a patterned dielectric film 136. Several through-glass vias (TGVs) 116 similarly penetrate the glass substrate 110 from a die side 109 to a land side 111.

The EMIB 124 is at least partially embedded in the glass substrate 110. This means the Z-height of the EMIB 124 may extend above the Z-height of the glass substrate 110.

FIG. 1A is a cross-section elevation of the semiconductor device package 100 depicted in FIG. 1 during assembly according to an embodiment. An inorganic substrate 101 such as a semiconductor-packaging quality glass substrate 110 is patterned with contact corridors 112 in preparation for filling with metallic vias (see FIG. 1C). The glass substrate 110 has a die side 109 and a land side 111, in reference to die and semiconductor package substrate locations depicted in FIG. 1 and during future assembly.

In an embodiment, the inorganic substrate 101 is a ceramic that has been fired and machined to allow the contact corridors 112 to have useful fiduciary quality for locating metallic vias. Hereinafter, the substrate 110 is referred to as a glass substrate 110, but it may be a useful inorganic non-glass such as the ceramic-substrate embodiments.

FIG. 1B is a cross-section elevation 102 of the glass substrate 110 depicted in FIG. 1A after further processing according to an embodiment. A seed layer 114 is plated onto the glass substrate 110, followed by an electroplating technique to fill the contact corridors 112 (see FIG. 1A) with a through-glass via (TGV) 116 according to an embodiment. In an embodiment, an electroless plating technique is done to locate the seed layer 114 such as a copper film 114 onto the respective die and land sides 109 and 111 of the glass substrate 110, as well as into the contact corridors 112. In an embodiment, sputtering technique is done to locate the seed layer 114 which is bi-layer of Titanium and Copper. In an embodiment, electroplating the TGV 116 uses a copper-electroplating technique.

FIG. 1C is a cross-section elevation 103 of the glass substrate 110 depicted in FIG. 1B after further processing according to an embodiment. A backgrinding process has removed the seed layer 114 and extra electrolytic plated copper from the respective die and land sides 109 and 111 of the glass substrate 110, as well as the backgrinding process has formed the TGVs 116.

In an embodiment after forming of the TGVs 116 as illustrated, a through-hole 118 is formed from the die side 109 to the land side 111, in preparation for seating a silicon-bridge interconnect within the through-hole 118. A "silicon-bridge interconnect" may be of a semiconductive material such as undoped silicon, or a III-V material. In an embodiment, a doped silicon material is used. After encasing the silicon bridge interconnect in a dielectric material, it is referred to as an EMIB.

Figure 1D:
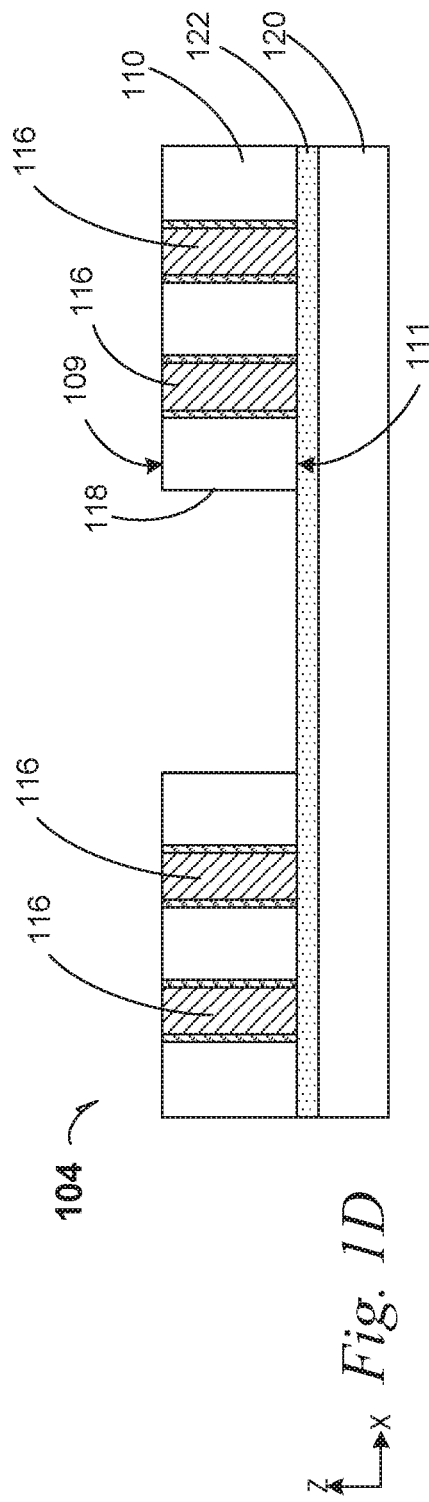
FIG. 1D is a cross-section elevation of the glass substrate depicted in FIG. 1C after further processing according to an embodiment.

FIG. 1D is a cross-section elevation 104 of the glass substrate 110 depicted in FIG. 1C after further processing according to an embodiment. The glass substrate 110 has been seated upon a carrier 120 such as a temporary glass carrier 120 with an adhesive 122 that secures the glass substrate 110 to a useful flatness for further processing.

Figure 1E:
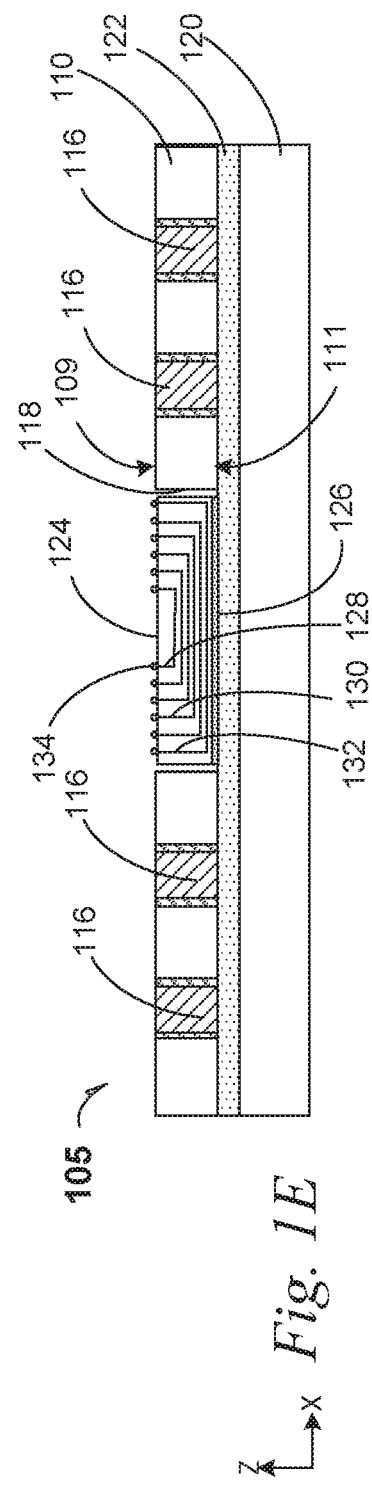
FIG. 1E is a cross-section elevation of a semiconductor device package after further processing of the glass substrate depicted in FIG. 1D according to an embodiment.

FIG. 1E is a cross-section elevation of a semiconductor device package 105 after further processing of the glass substrate 110 depicted in FIG. 1D according to an embodiment.

The semiconductor device package 105 has been processed by height-reducing (negative-Z direction) the glass substrate 110 such that the die side 109 is lowered, closer to the land side 111. The height reduction is done when a specific silicon bridge of a given useful Z-height, is less than the Z-height of the glass substrate 110. In an embodiment, no height reduction of the glass substrate 110 is done as a specific silicon bridge sufficiently matches the Z-height of the glass substrate 110, within useful processing and assembly parameters.

Further assembly includes seating a silicon bridge 124 in the through-hole 118. In an embodiment, a bridge adhesive 126 is located on the backside of the silicon bridge 124, to facilitate locating the bridge die 126. The bridge adhesive 126 may also be referred to as a die-attach film (DAF).

In an embodiment, the silicon bridge die 124 has several layers of metallization including Z-direction via portions if necessary, and longitudinal (X- and Y-direction) trace portions. Several bridge traces, e.g. 128, 130 and 132, among others, are depicted, among other bridge traces when useful. In an embodiment, the bridge die 124 is bumped to contact the metallization layers, such as with an electrical bump, one occurrence of which is depicted with reference number 134.

In an embodiment, where the Z-height of the glass substrate 110 is unity, the Z-height of the silicon bridge 124 is in a range from 80 percent of unity, to 98 percent of unity. The Z-height ratio is controlled in part by selecting of bump size 134.

Figure 1F:
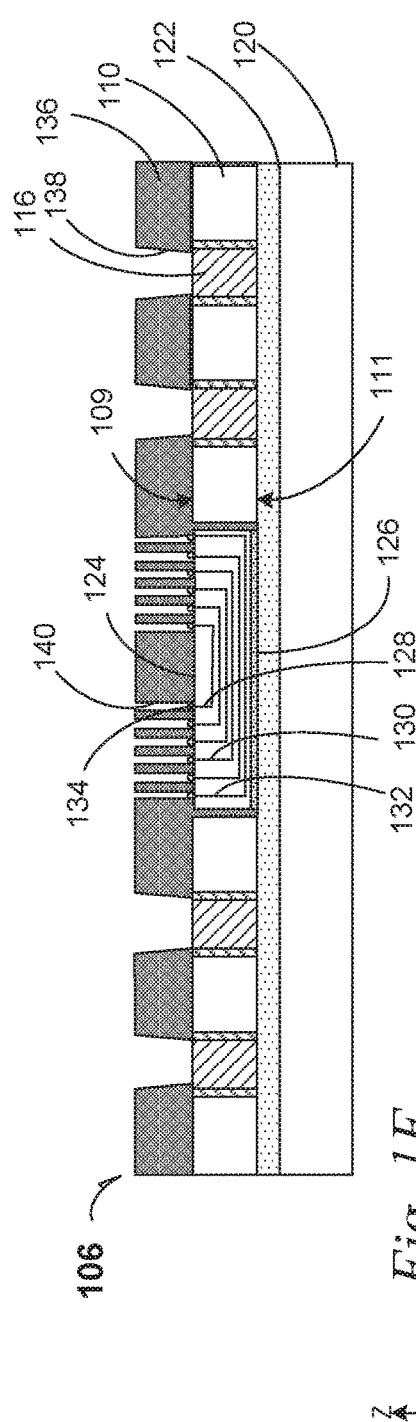
FIG. 1F is a cross-section elevation of the semiconductor device package depicted in FIG. 1E after further processing according to an embodiment.

FIG. 1F is a cross-section elevation of the semiconductor device package 105 depicted in FIG. 1E after further processing according to an embodiment. The semiconductor device package 106 has been processed by encapsulating the die side 109 with an EMIB-level dielectric film 136 upon the die side 109. The EMIB-level dielectric film 136 fills into the through-hole 118 (see FIG. 1E) to embed the bridge die 124 such that it is useful as an embedded multi-die interconnect bridge (EMIB) die 124.

In an embodiment, the Z-height of the bridge die 124 is taller than the Z-height of the glass substrate 110, to make the bridge die 124 at least partially embedded. In an embodiment, the Z-height of the bridge die 124 is equal to the Z-height of the glass substrate 110 within processing parameters, to make the bridge die 124 at least partially embedded. In an embodiment, the Z-height of the bridge die 124 is less than the Z-height of the glass substrate 110, to make the bridge die 124 at least partially embedded. In an embodiment, the Z-height of the bridge die 124 is about 96 percent the Z-height of the glass substrate 110.

After seating and encapsulating the EMIB die 124, processing is followed by patterning the EMIB-level dielectric film 136 to open middle contact corridors, one occurrence of which is indicated with reference number 138. The middle contact corridors open to the TGVs 116, which may be referred to as land-side filled vias 116. Patterning the EMIB-level dielectric film 136 is also done above the electrical bumps 136 to open bridge-bump contact corridors, one occurrence of which is indicated with reference number 140, which exhibit a smaller scale than the middle contact corridors 138 for exposing the TGVs 116. In an embodiment, laser drilling techniques are used for each of the contact corridors 138 and 140, depending upon contact-corridor aspect ratios of area and depth. In an embodiment, laser drilling is used to open the bridge-bump contact corridors 140, and photolithography is used to open the middle contact corridors 138.

Figure 1G:
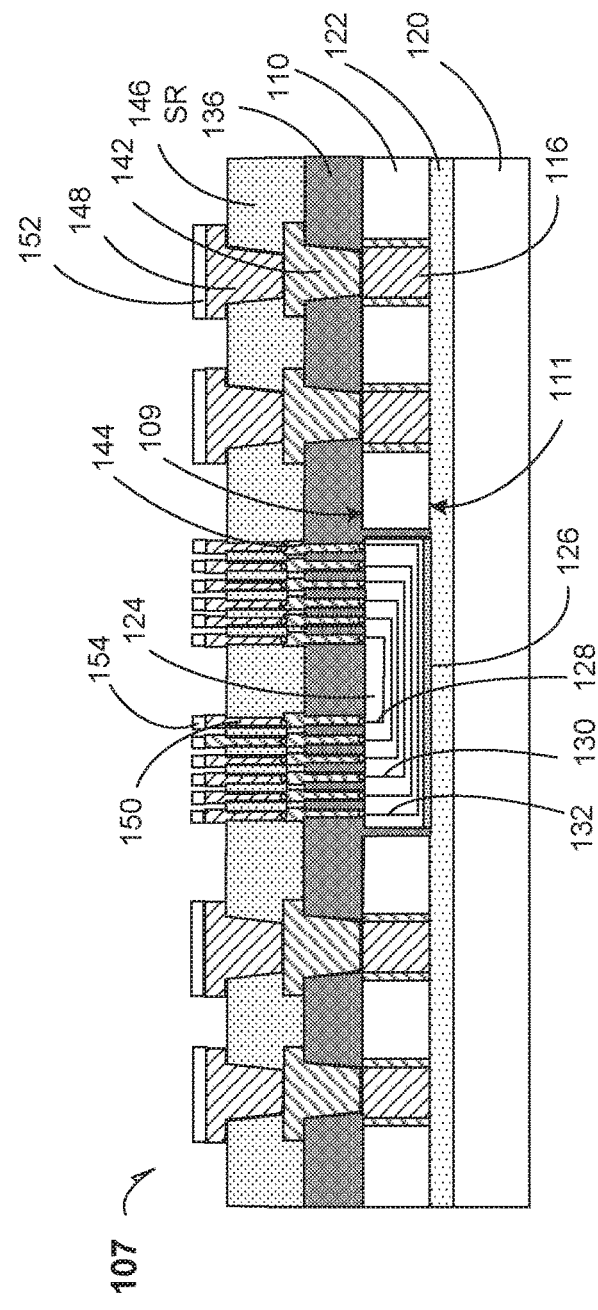
FIG. 1G is a cross-section elevation of the semiconductor device package depicted in FIG. 1F after further processing according to an embodiment.

FIG. 1G is a cross-section elevation of the semiconductor device package 106 depicted in FIG. 1F after further processing according to an embodiment. The semiconductor device package 107 has been processed by filling and patterning into the EMIB-level dielectric film 136, second-level filled vias 142 and second-level EMIB vias 144. The second-level package vias 142 and 144 are distinguished as being next to the TGVs 116. Thereafter in an embodiment, the second-level vias 142 and the second-level EMIB vias 144 are added to, by patterning a die-level interlayer dielectric (ILD) 146, and filling and patterning into the die-level ILD 146, die level filled vias 148 and die-level EMIB vias 150. In an embodiment, a solder film 152 and 154 is applied to the respective die-level filled vias 148 and die-level EMIB vias 150.

In an embodiment, patterning of the ILD 146, involves using a photo-imageable dielectric (PID) 146, patterning using light exposure, and removing material to leave contact corridors. As a result, the PID 146 may be referred to as a photoresist. In an embodiment, patterning of the ILD 146, involves laser drilling contact corridors for the vias 150, and photo imaging contact corridors for the vias 148.

Reference is again made to FIG. 1. After forming the die-level vias 148 and 150, as well as the solder films 152 and 154, a first semiconductive device 156 is bonded to the vias. In an embodiment, the first semiconductive device 156 includes an active surface and metallization 158, coupled to substrate bond pads 160 for coupling to TGVs 116, and EMIB bond pads 162 for coupling to the bridge traces, e.g. to the bridge trace 128 in the EMIB 124.

In an embodiment to make a modular die 100, a plurality of first-semiconductive-device chiplets are assembled to the first die 156. For example, a first, first-die chiplet 164, a subsequent, first-die chiplet 166 and a third, first-die chiplet 168 are coupled to the first die 156. In an exemplary embodiment, the first, first-die chiplet 164 is coupled to EMIB 124 through the first die 156 by a through-silicon via (TSV) 170 that contacts the active surface and metallization 158 through the first die 156, and emerges at a first-die backside surface 172. In an embodiment, the chiplets are fabricated at a smaller design-rule geometry than that of the first and subsequent semiconductive devices. For example, the chiplet 164 is fabricated at a 7 nanometer (nm) design-rule geometry, and the first semiconductive device 156 is fabricated at a 10 nm design-rule geometry. The EMIB die 124 has routing lines capable of connecting backsides of the coarser devices 156 and 174, while the coarser devices 156 and 174, and the chiplets 164, 166, 168 182, 184 and 186 are coupled face-to-face with the active surfaces contact across electrical bumps.

In an embodiment, a subsequent semiconductive device 174 is bonded to die-level vias 148 and 150. In an embodiment, the subsequent semiconductive device 174 includes an active surface and metallization 176, substrate bond pads 178 for coupling to TGVs 116, and EMIB bond pads 180 for coupling to the bridge traces, e.g. to the bridge trace 130 in the EMIB 124.

In an embodiment to further extend capabilities of the modular die 100, a plurality of subsequent-semiconductive-device chiplets are assembled to the subsequent die 174. For example, a first, subsequent-die chiplet 182, a subsequent, subsequent-die chiplet 184 and a third, subsequent-die chiplet 186 are coupled to the subsequent die 174. In an exemplary embodiment, the first, subsequent-die chiplet 182 is coupled to EMIB 124 through the subsequent die 174 by a TSV via 188 that contacts the active surface and metallization 176 through the subsequent die 174, and emerges at a subsequent-die backside surface 190.

After assembly of the several chiplets, and other useful structures to the die backside surfaces 172 and 190, an encapsulation mass 192 covers the several first and subsequent dice as well as at least a portion of the first and subsequent-die chiplets 164, 166 and 168, and 182, 184 and 186, respectively.

Figure 1H:
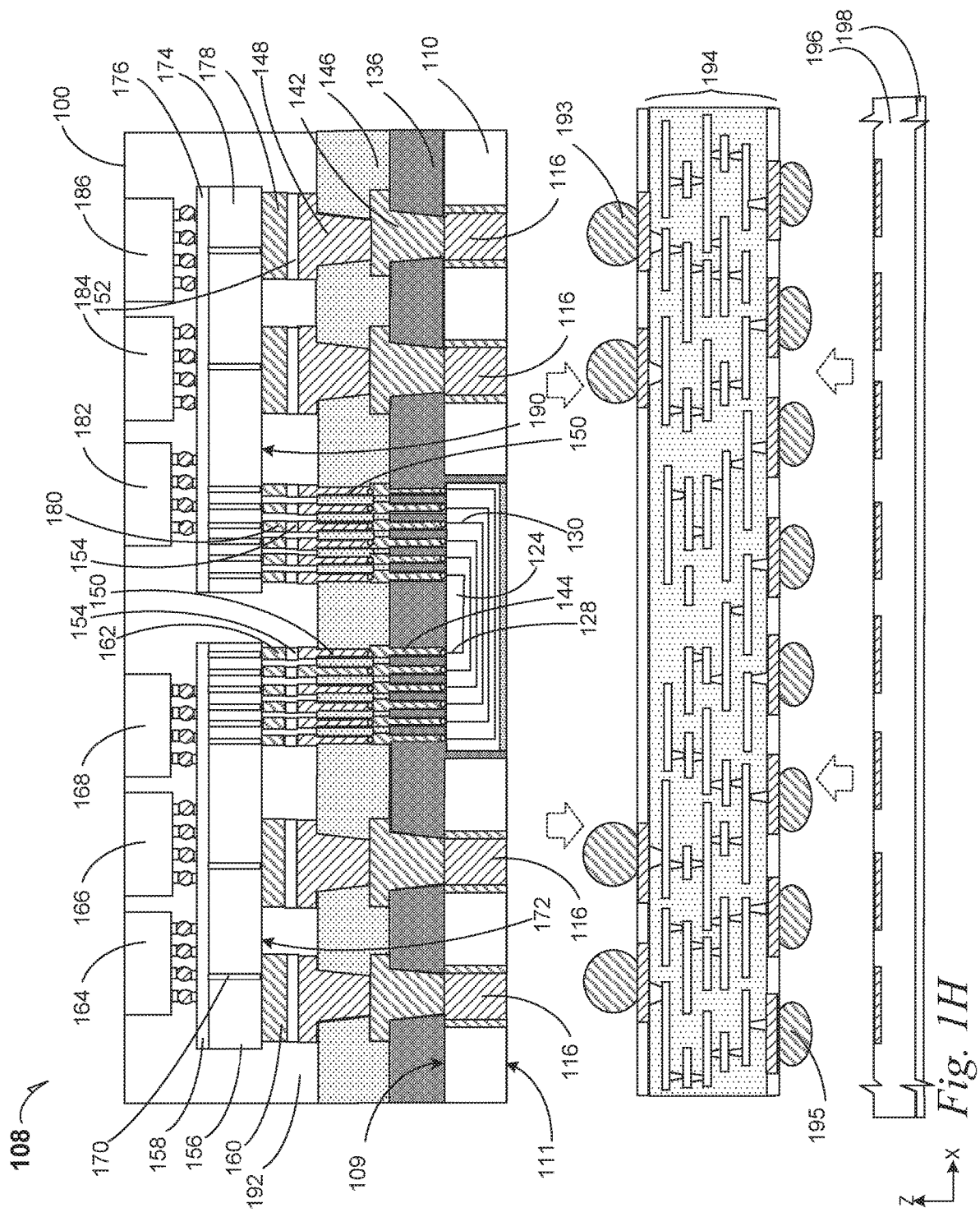
FIG. 1H is a cross-section elevation of the modular die depicted in FIG. 1 after further processing according to several embodiments.

FIG. 1H is a cross-section elevation of the modular die 10 depicted in FIG. 1 after further processing according to several embodiments. A semiconductor device package 108 is being assembled as the modular die 100 is being seated onto a semiconductor package substrate 194, as indicated by the directional arrows.

In an embodiment, the semiconductor device package 108 is further assembled to a computing system, as a board 196 is being assembled to the semiconductor package substrate 194 as indicated by the directional arrows. In an embodiment, the board 196 is such as printed wiring board 196. In an embodiment, the printed wiring board 196 includes an external shell 198 that acts as an external boundary of a computing system that houses the modular die 100, where in an embodiment, the external shell 198 is the outside of a tablet computer or a wireless telephone.

After assembly, the modular die 100 is characterized at the bond pads 160, 162 and 178 and 180 as first-level interconnects (FLIs), that also includes the solder films 150 and 152. Further, electrical bumps 193 on the semiconductor package substrate 194 that face the land side 111, are characterized as mid-level interconnects (MLIs). Further, electrical bumps 195 on the semiconductor package substrate 194 that face the board 196, are characterized as substrate-level interconnects (SLIs).

Figure 2:
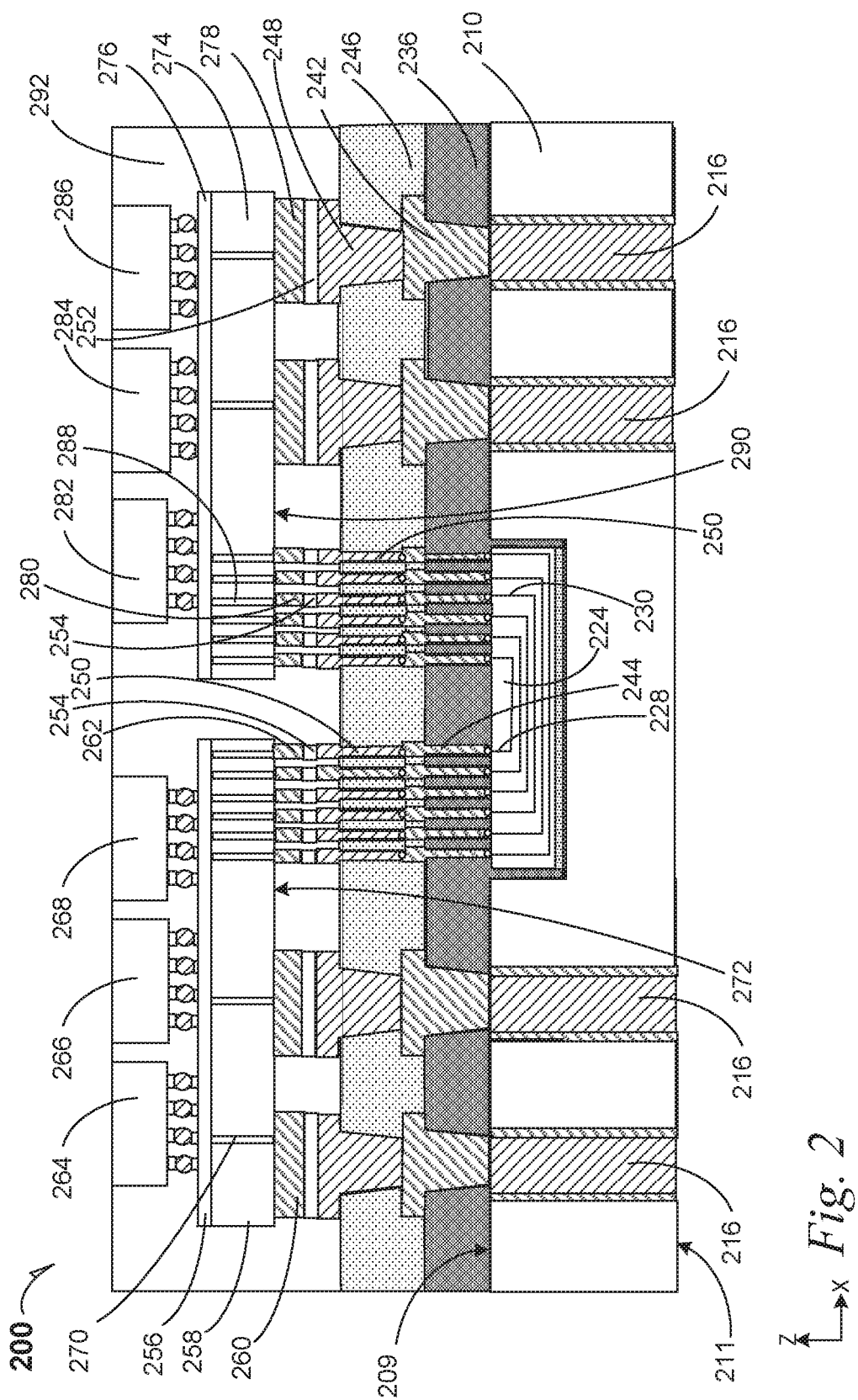
FIG. 2 is a cross-section elevation of a modular semiconductive device according to an embodiment.

FIG. 2 is a cross-section elevation of a modular semiconductive device 200 according to an embodiment.

A glass substrate 210 has an embedded multi-die interconnect bridge (EMIB) 224 in a recess 218 (see FIG. 2C) portion of the glass substrate 210. The EMIB 224 is embedded in a patterned dielectric film 236. Several through-glass vias (TGVs) 216 similarly penetrate the glass substrate 210 from a die side 209 to a land side 211.

Figure 2A:
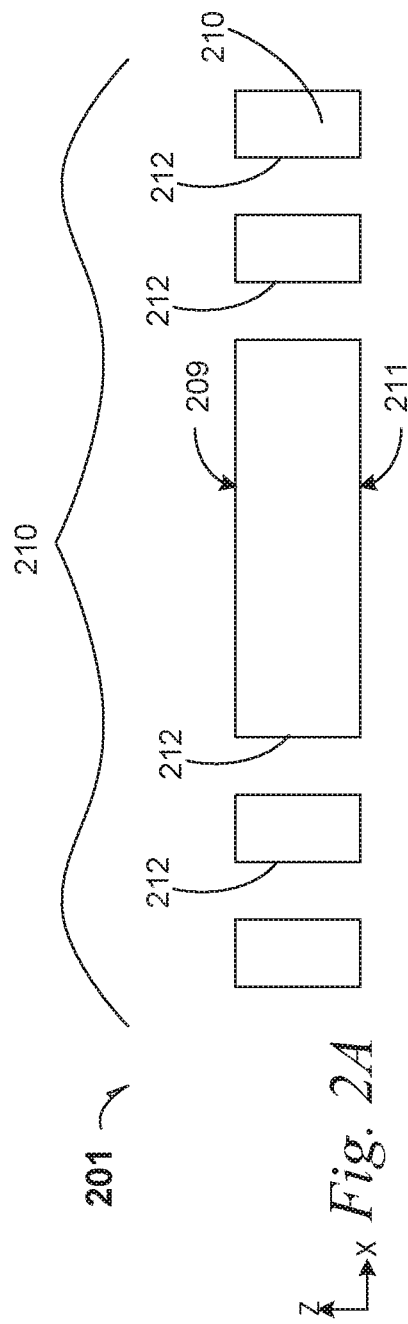
FIG. 2A is a cross-section elevation of the modular die package depicted in FIG. 2 during assembly according to an embodiment.

FIG. 2A is a cross-section elevation of the modular die package 200 depicted in FIG. 2 during assembly according to an embodiment. An inorganic substrate 201 such as a semiconductor-packaging quality glass substrate 210 is patterned with contact corridors 212 in preparation for filling with metallic vias (see FIG. 2C). The glass substrate 210 has a die side 209 and a land side 211, in reference to die and semiconductor package substrate locations depicted in FIG. 2 and during future assembly.

In an embodiment, the inorganic substrate 201 is a ceramic that has been fired and machined to allow the contact corridors 212 to have useful fiduciary quality for locating metallic vias. Hereinafter, the substrate 210 is referred to as a glass substrate 210, but it may be a useful inorganic non-glass such as the ceramic-substrate embodiments.

Figure 2B:
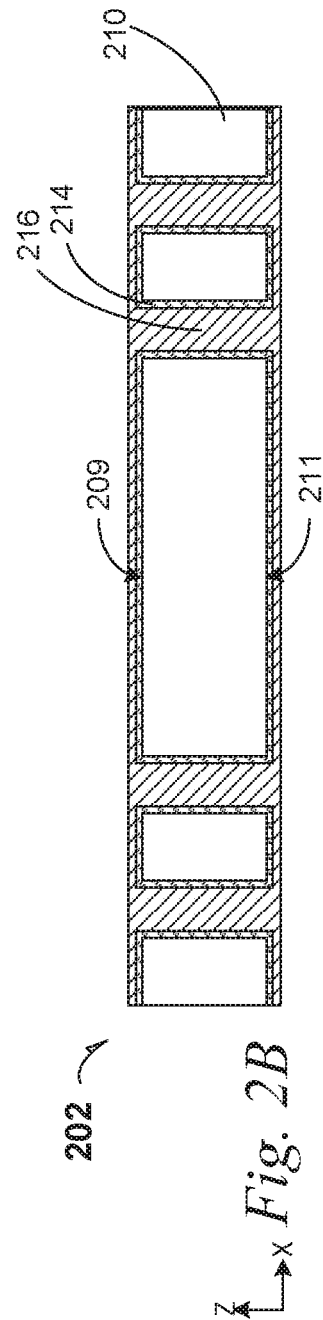
FIG. 2B is a cross-section elevation of the glass substrate depicted in FIG. 2A after further processing according to an embodiment.

FIG. 2B is a cross-section elevation 202 of the glass substrate 210 depicted in FIG. 2A after further processing according to an embodiment. A seed layer 214 is plated onto the glass substrate 210, followed by an electroplating technique to fill the contact corridors 212 (see FIG. 2A) with a through-glass via (TGV) 216 according to an embodiment. In an embodiment, an electroless plating technique is done to locate the seed layer 214 as a copper film 214 onto the respective die and land sides 209 and 211 of the glass substrate 210, as well as into the contact corridors 212. In an embodiment, sputtering technique is done to locate the seed layer 214 is a which is bi-layer of Titanium and Copper. In an embodiment, electroplating the TGV 216 uses a copper-electroplating technique.

Figure 2C:
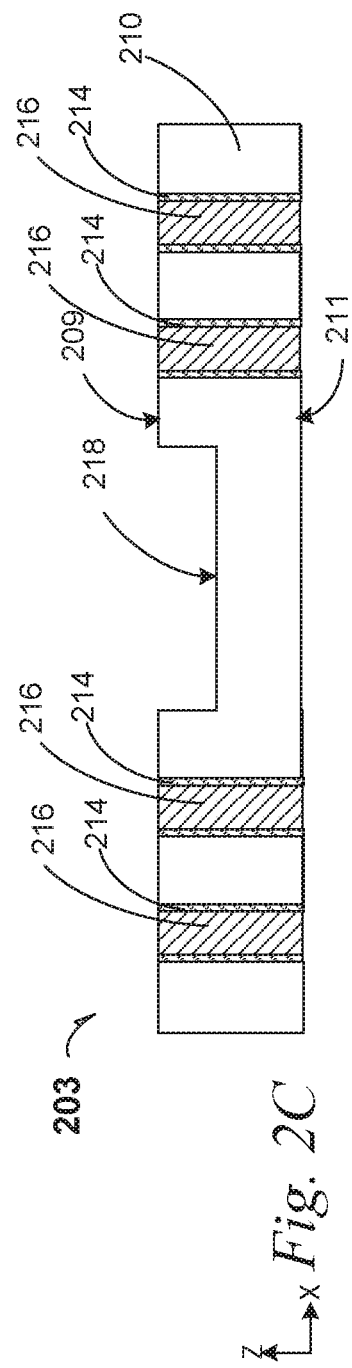
FIG. 2C is a cross-section elevation of the glass substrate depicted in FIG. 2B after further processing according to an embodiment.

FIG. 2C is a cross-section elevation 203 of the glass substrate 210 depicted in FIG. 2B after further processing according to an embodiment. A backgrinding process has removed the seed layer 214 and extra electrolytic plated copper from the respective die and land sides 209 and 211 of the glass substrate 210, as well as the backgrinding process has formed the TGVs 216.

In an embodiment after forming of the TGVs 216 as illustrated, a recess 218 is formed from the die side 209 but not reaching the land side 211, in preparation for seating a silicon-bridge interconnect within the recess 218. A "silicon-bridge interconnect" may be of a semiconductive material such as undoped silicon, or a III-V material. In an embodiment, a doped silicon material is used. After encasing the silicon bridge interconnect in a dielectric material, it is referred to as an EMIB.

FIG. 2D is a cross-section elevation 204 of the glass substrate 210 depicted in FIG. 2C after further processing according to an embodiment. The glass substrate 210 has been seated upon a carrier 220 such as a temporary glass carrier 220 with an adhesive 222 that secures the glass substrate 210 to a useful flatness for further processing.

FIG. 2E is a cross-section elevation of a semiconductor device package 205 after further processing of the glass substrate 210 depicted in FIG. 2D according to an embodiment. The semiconductor device package is enhanced by seating a silicon bridge 224 in the recess 218. In an embodiment, a bridge adhesive 226 is located on the backside of the silicon bridge 224, to facilitate locating the bridge die 226. The bridge adhesive 226 may also be referred to as a die-attach film (DAF) 226.

In an embodiment, the silicon bridge die 224 has several layers of metallization including Z-direction via portions if necessary, and longitudinal (X- and Y-direction) trace portions. Several bridge traces, e.g. 228, 230 and 232 are depicted, among other bridge traces when useful. In an embodiment, the bridge die 224 is bumped to contact the metallization layers, such as with an electrical bump, one occurrence of which is depicted with reference number 234.

Figure 2F:
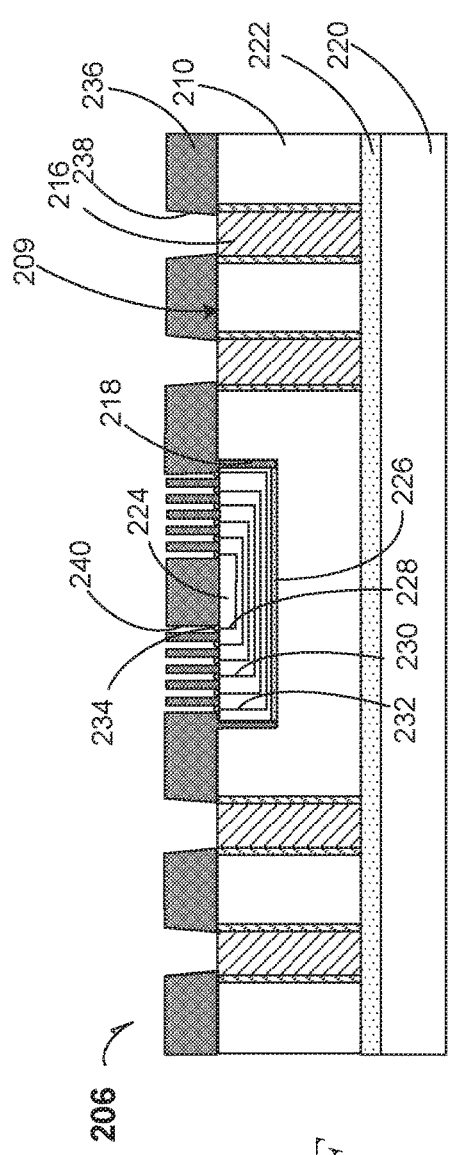
FIG. 2F is a cross-section elevation of the semiconductor device package depicted in FIG. 2E after further processing according to an embodiment.

FIG. 2F is a cross-section elevation of the semiconductor device package 205 depicted in FIG. 2E after further processing according to an embodiment. The semiconductor device package 206 has been processed by encapsulating the die side 209 with an EMIB-level dielectric film 236 upon the die side 209. The EMIB-level dielectric film 236 fills into the recess 218 (see also FIG. 2E) to embed the bridge die 224 such that it is useful as an embedded multi-die interconnect bridge (EMIB) die 224.

After seating and encapsulating the EMIB die 224, processing is followed by patterning the EMIB-level dielectric film 236 to open middle contact corridors, one occurrence of which is indicated with reference number 238. The middle contact corridors open to the TGVs 216, which may be referred to as land-side filled vias 216. Patterning the EMIB-level dielectric film 236 is also done above the electrical bumps 236 to open bridge-bump contact corridors, one occurrence of which is indicated with reference number 240, which exhibit a smaller scale than the middle contact corridors 238 for exposing the TGVs 216. In an embodiment, laser drilling techniques are used for each of the contact corridors 238 and 240, depending upon contact-corridor aspect ratios of area and depth, in an embodiment, laser drilling is used to open the bridge contact corridors 240, and photolithography is used to open substrate contact corridors 238.

Figure 2G:
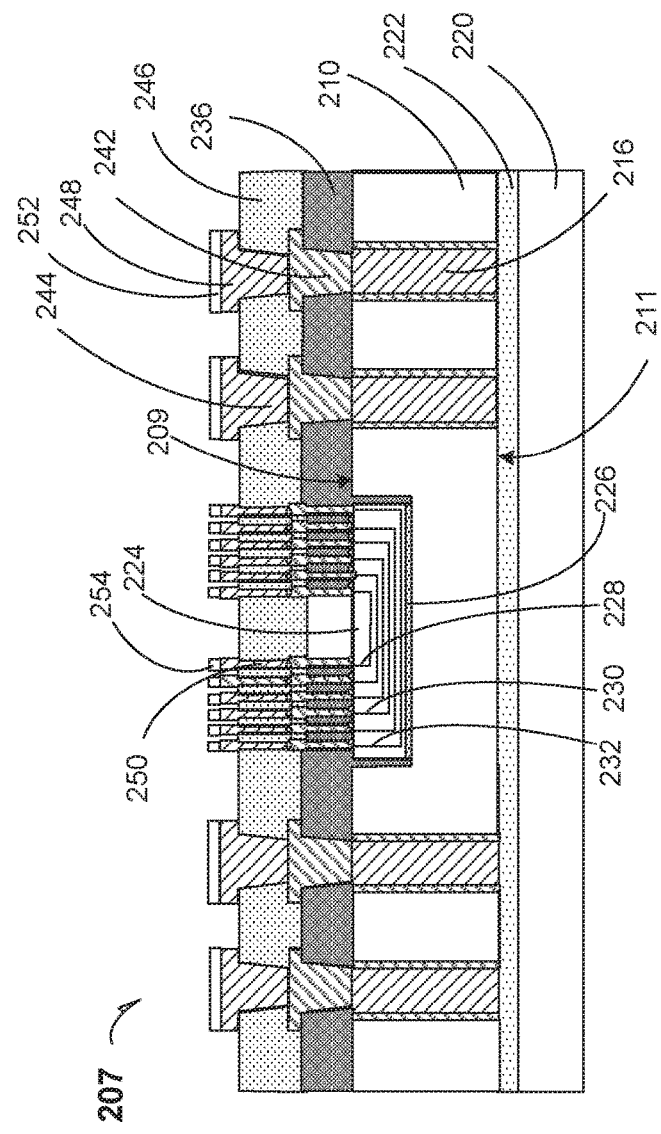
FIG. 2G is a cross-section elevation of the semiconductor device package depicted in FIG. 2F after further processing according to an embodiment.

FIG. 2G is a cross-section elevation of the semiconductor device package 206 depicted in FIG. 2F after further processing according to an embodiment. The semiconductor device package 207 has been processed by filling and patterning into the EMIB-level dielectric film 236, second-level filled vias 242 and second-level EMIB vias 244. The second-level vias 242 and 244 are distinguished as being next to the TGVs 216. In an embodiment, the chiplets are fabricated at a smaller design-rule geometry than that of the first and subsequent semiconductive devices. For example, the chiplet 264 is fabricated at a 7 nanometer (nm) design-rule geometry, and the first semiconductive device 156 is fabricated at a 10 nm design-rule geometry. The EMIB die 224 has routing lines capable of connecting backsides of the coarser devices 256 and 274, while the coarser devices 256 and 274, and the chiplets 264, 266, 268 282, 284 and 286 are coupled face-to-face with the active surfaces contact across electrical bumps. Thereafter in an embodiment, the second-level vias 242 and the second-level EMIB vias 244 are added to, by patterning a die-level interlayer dielectric (ILD) 246, and filling and patterning into the die-level ILL) 246, die-level filled vias 248 and die-level EMIB vias 250. In an embodiment, a solder film 252 and 254 is applied to the respective die-level filled vias 248 and die-level EMIB vias 250.

In an embodiment, patterning of the ILD 246, involves using a photo-imageable dielectric (PID) 246, patterning using light exposure, and removing material to leave contact corridors. As a result, the PID 246 may be referred to as a photoresist. In an embodiment, patterning of the ILD 246, involves laser drilling contact corridors for the vias 250, and photo imaging contact corridors for the vias 248.

Reference is again made to FIG. 2. After forming the die-level vias 248 and 250, as well as the solder films 252 and 254, a first semiconductive device 256 is bonded to the vias. In an embodiment, the first semiconductive device 256 includes an active surface and metallization 258, substrate bond pads 260 for coupling to TGVs 216, and EMIB bond pads 262 for coupling to the bridge traces, e.g. to the bridge trace 228 in the EMIB 224.

In an embodiment to make a modular die 200, a plurality of first-semiconductive-device chiplets are assembled to the first die 256. For example, a first, first-die chiplet 264, a subsequent, first-die chiplet 266 and a third, first-die chiplet 268 are coupled to the first die 256. In an exemplary embodiment, the first, first-die chiplet 264 is coupled to EMIB 224 through the first die 256 by a through-silicon via (TSV) 270 that contacts the active surface and metallization 258, and emerges at a first-die backside surface 272.

In an embodiment, a subsequent semiconductive device 274 is bonded to die-level vias 248 and 250. In an embodiment, the subsequent semiconductive device 274 includes an active surface and metallization 276, substrate bond pads 278 for coupling to TGVs 216, and EMIB bond pads 280 for coupling to the bridge traces, e.g. to the bridge trace 230 in the EMIB 224.

In an embodiment to further extend capabilities of the modular die 200, a plurality of subsequent-semiconductive-device chiplets are assembled to the subsequent die 274. For example, a first, subsequent-die chiplet 282, a subsequent, subsequent-die chiplet 284 and a third, subsequent-die chiplet 286 are coupled to the subsequent die 274. In an exemplary embodiment, the first, subsequent-die chiplet 282 is coupled to EMIB 224 through the subsequent die 274 by a TSV 288 that contacts the active surface and metallization 276 through the subsequent die 274, and emerges at a subsequent-die backside surface 290.

After assembly of the several chiplets, and other useful structures to the die backside surfaces 272 and 290, an encapsulation mass 292 covers the several first and subsequent dice as well as at least a portion of the first and subsequent-die chiplets 264, 266 and 268, and 282, 284 and 286, respectively.

Figure 2H:
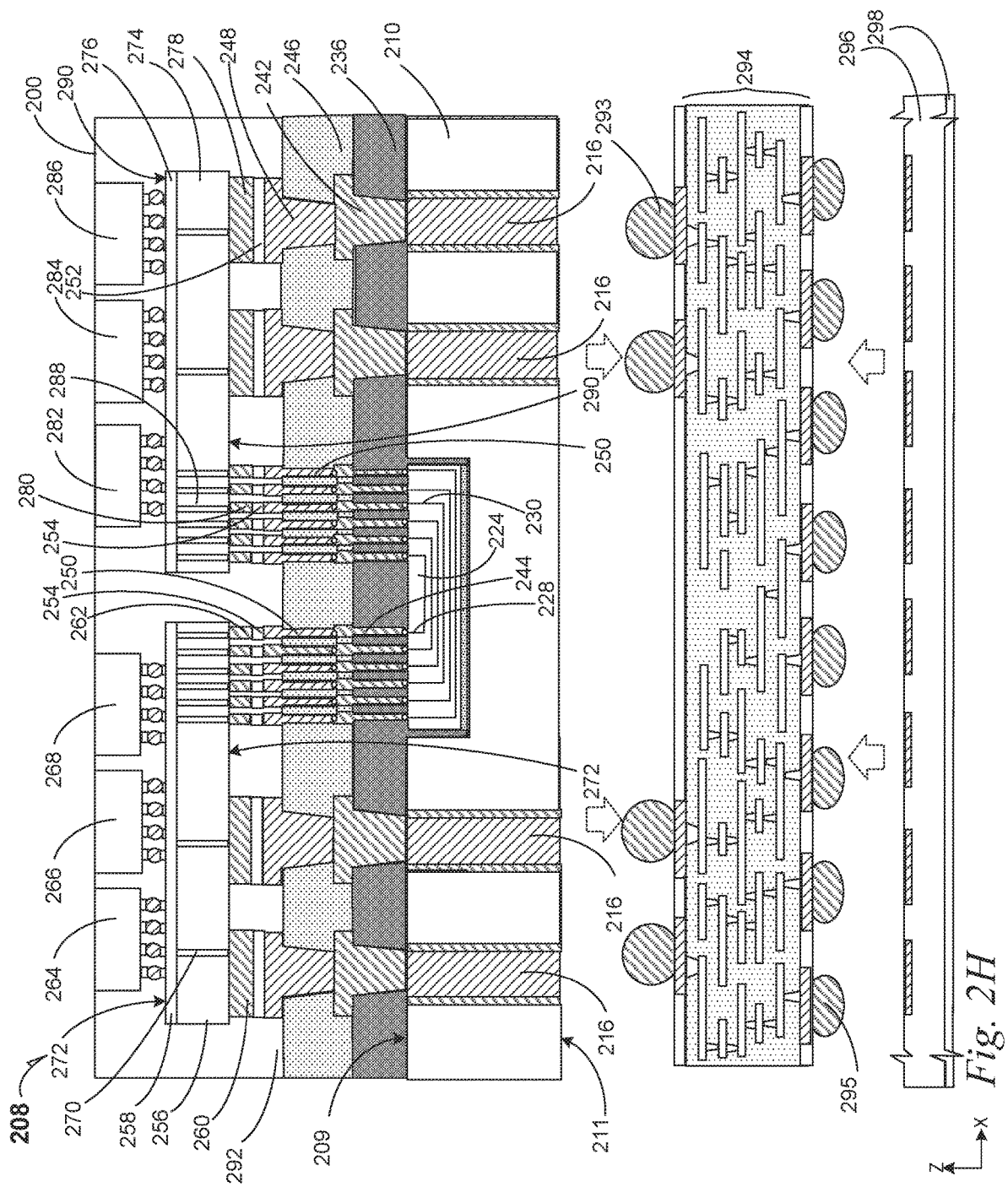
FIG. 2H is a cross-section elevation of the modular die depicted in FIG. 2 after further processing according to several embodiments.

FIG. 2H is a cross-section elevation of the modular die 200 depicted in FIG. 2 after further processing according to several embodiments. A semiconductor device package 208 is being assembled as the modular die 200 is being seated onto a semiconductor package substrate 294, as indicated by the directional arrows.

In an embodiment, the semiconductor device package 208 is further assembled to a computing system, such as a board 296 is being assembled to the semiconductor package substrate 294 as indicated by the directional arrows. In an embodiment, the board 296 is a printed wiring board 296. In an embodiment, the printed wiring board 296 includes an external shell 298 that acts as an external boundary of a computing system that houses the modular die 200, where in an embodiment, the external shell 298 is the outside of a tablet computer or a wireless telephone.

After assembly, the modular die 200 is characterized at the bond pads 260, 262 and 278 and 280 as first-level interconnects (FLIs), that also includes the solder films 250 and 252. Further, electrical bumps 293 on the semiconductor package substrate 294 that face the land side 211, are characterized as mid-level interconnects (MLIs). Further, electrical bumps 295 on the semiconductor package substrate 294 that face the board 296, are characterized as substrate-level interconnects (SLIs).

FIG. 3 is a top plan 300 of the modular die 100 depicted in FIG. 1 according to an embodiment. The modular die 100 depicted in FIG. 1 is seen at the cross-section line 1-1. The first semiconductive device 156 is seen in hidden lines as it is hidden in the encapsulation mass 192, as well as is the subsequent semiconductive device 174. The first-die chiplets 164, 166 and 168 are seen above the first die 156, and each chiplet emerges from the encapsulation mass 192 to expose backsides according to an embodiment. Similarly, the subsequent-die chiplets 182, 184 and 186 are seen above the subsequent die 174, and each chiplet emerges from the encapsulation mass 192 to expose backsides according to an embodiment.

In an embodiment, a 3×4 array of chiplet spaces is configured on the backside surface of the first die 156, but four of the spaces are taken up by heat slugs 363 to facilitate heat removal from the first die 156 and into a heat sink such as an integrated heat spreader that contacts the heat slugs. Similarly in an embodiment, a 3×4 array of chiplet spaces is configured on the backside surface of the subsequent die 174, but four of the spaces are taken up by heat slugs 381 to facilitate heat removal from the subsequent die 174 and into the same heat sink that contacts the heat slugs 363 according to an embodiment.

As illustrated, different useful patterns for heat slugs 363 and 381 are applied above the respective first and subsequent dice 156 and 174, depending upon heat-extraction usefulness.

FIG. 4 is a cross-section elevation of a semiconductor device package 405 during processing of a glass substrate 410 according to an embodiment. The semiconductor device package 405 has different silicon-bridge-accommodating capabilities, where a through hole 418 accepts a silicon bridge 424 that is taller (Z-direction) compared to a recess 418' that is accepting a silicon bridge 424'. In the illustrated embodiment, at least two different-height silicon bridges 424 and 424' are configured to service at least three semiconductive devices that couple to the two silicon bridges 424 and 424'.

Figure 5:
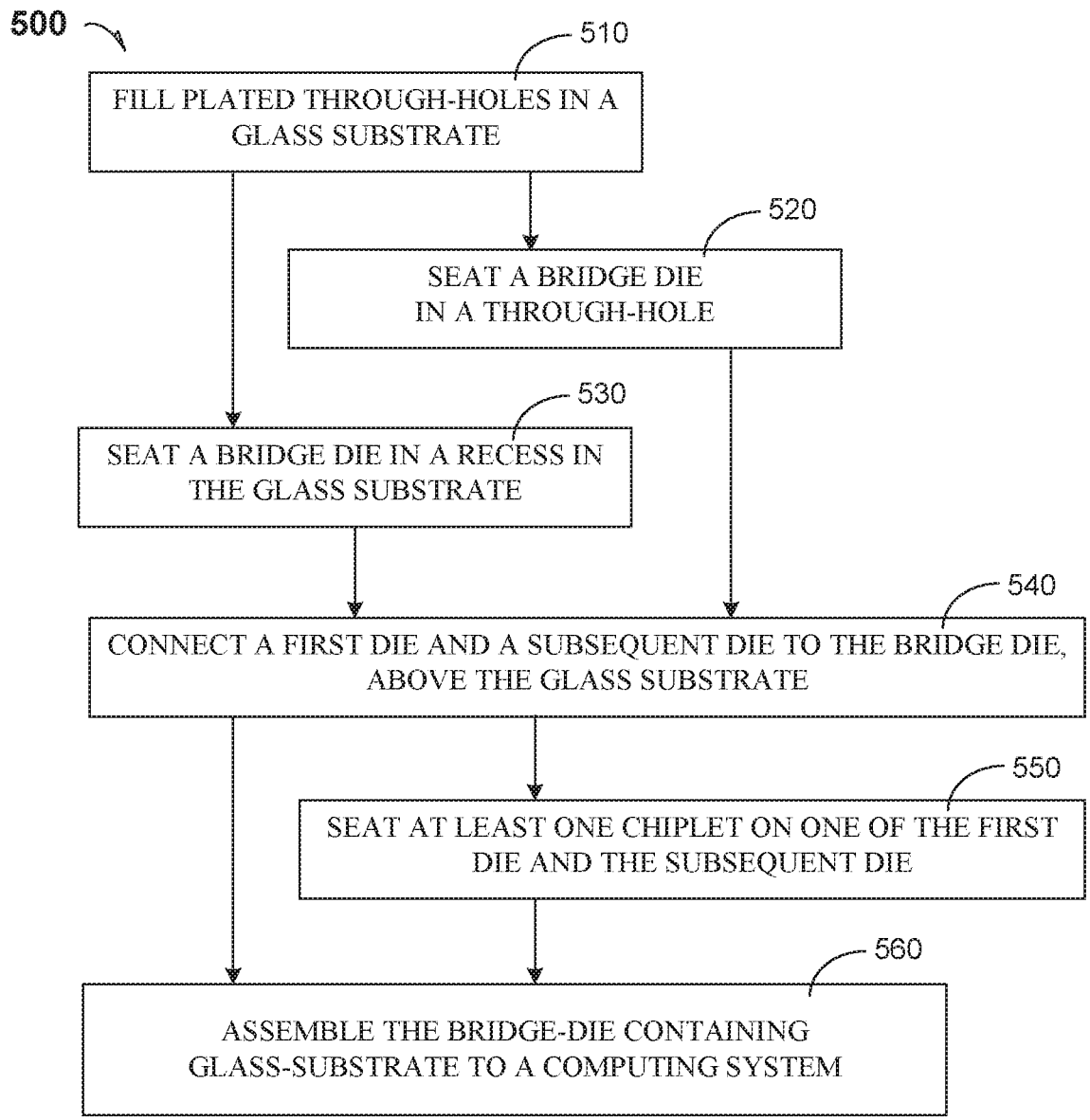
FIG. 5 is a process flow diagram according to several embodiments.

FIG. 5 is a process flow diagram according to several embodiments.

At 510, the process includes filling a plated through-hole in a glass substrate. In a non-limiting example embodiment, a via 116 is plated into a through-hole 112 in the glass substrate 110.

At 520, the process includes seating a bridge die in a through-hole in the glass substrate. In a non-limiting example embodiment, the bridge die 124 is seated in the through-hole 118 in the glass substrate 110.

At 530, the process includes seating a bridge die in a recess in the glass substrate. In a non-limiting example embodiment, the bridge die 224 is seated in the recess 218 in the glass substrate 210.

At 540, the process includes connecting a first die and a subsequent die to the bridge die, above the glass substrate. In a non-limiting example embodiment, a first die 156 and a subsequent die 174 are connected to the bridge die 124 above the glass substrate 110.

At 550, the process includes seating at least one chiplet on one of the first die and the subsequent die. In a non-limiting example embodiment, a first-die first chiplet 164 is seated on the first die 156.

At 560, the process includes assembling the bridge-die-containing glass substrate to a computing system.

Figure 6:
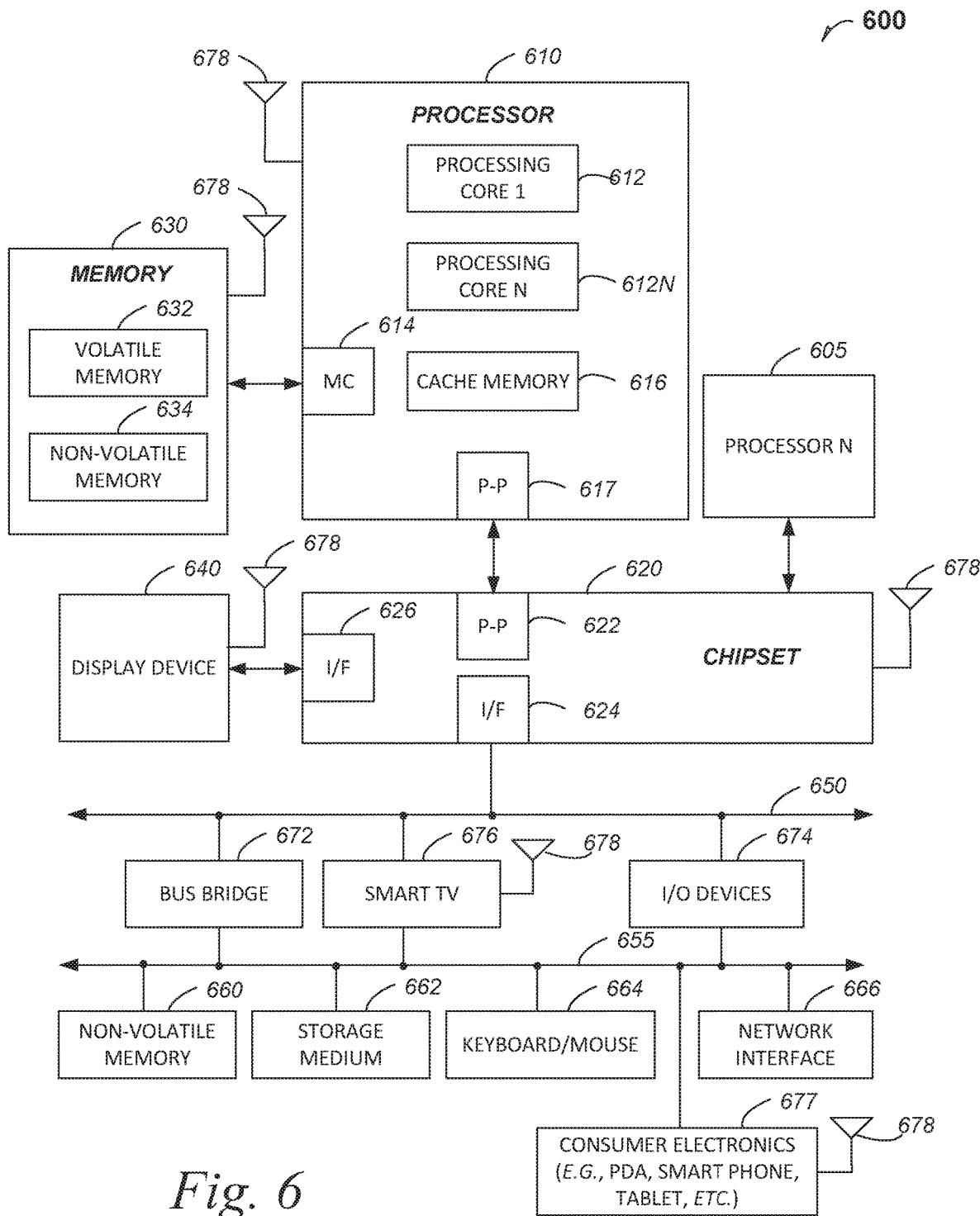
FIG. 6 is included to show an example of a higher-level device application for the disclosed embodiments.

FIG. 6 is included to show an example of a higher-level device application for the disclosed embodiments. The bridge die in glass substrate bridge die in glass substrate embodiments may be found in several parts of a computing system. In an embodiment, the bridge die in glass substrate is part of a communications apparatus such as is affixed to a cellular communications tower. In an embodiment, a computing system 600 includes, but is not limited to, a desktop computer. In an embodiment, a system 600 includes, but is not limited to a laptop computer. In an embodiment, a system 600 includes, but is not limited to a netbook. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 600 includes, but is not limited to an internet appliance. Other types of computing devices may be configured with the microelectronic device that includes bridge die in glass substrate embodiments.

In an embodiment, the processor 610 has one or more processing cores 612 and 612N, where 612N represents the Nth processor core inside processor 610 where N is a positive integer. In an embodiment, the electronic device system 600 using an embedded magnetic inductor and EMIB die embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the embedded magnetic inductor and EMIB die in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of a system-in-package with a bridge die in glass substrate depicted in FIGS. 1H, 2, 3 and 4. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a bridge die in glass substrate embodiment as set forth in this disclosure. The chipset 620 enables the processor 610 to connect to other elements in a bridge die in glass substrate embodiment in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into a bridge die in glass substrate in a computing system. Additionally, the chipset 620 connects to one or more buses 650 and 655 that interconnect various elements 674, 660, 662, 664, and 666. Buses 650 and 655 may be interconnected together via a bus bridge 672 such as at least one bridge die in glass substrate apparatus embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid state drive, a hard disk drive, a universal serial bus flash memory drive, or any other form of computer data storage medium. In one embodiment, the network interface 666 is implemented by any type of well-known network interface standard including, but not limited to, an Ethernet interface, a universal serial bus (USB) interface, a Peripheral Component interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the embedded magnetic inductor and a bridge die in glass substrate in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

Where useful, the computing system 600 may have a broadcasting structure interface such as for affixing the apparatus to a cellular tower.

To illustrate the embedded magnetic inductor and bridge die in glass substrate embodiments and methods disclosed herein, a non-limiting list of examples is provided herein:

Example 1 is a modular semiconductive device, comprising: an at least partially embedded multi-die interconnect bridge (EMIB) in a glass substrate, wherein the glass substrate includes a die side and a land side; a plurality of through-glass vias (TGVs) that communicate from the die side to the land side; a first semiconductive device coupled to the EMIB and to at least one TGV, wherein the first semiconductive device includes substrate bond pads that couple to the at least one TGV, and EMIB bond pads that couple to the EMIB; and a subsequent semiconductive device coupled to the EMIB and to at least one TGV, wherein the subsequent semiconductive device includes substrate bond pads that couple to the at least one TGV, and EMIB bond pads that couple to the EMIB.

In Example 2, the subject matter of Example 1 optionally includes at least one first chiplet coupled to the first semiconductive device, wherein the at least one first chiplet is on the first semiconductive device at an active surface.

In Example 3, the subject matter of any one or more of Examples 1-2 optionally include at least one first chiplet coupled to the first semiconductive device, wherein the at least one first chiplet is on the first semiconductive device at an active surface; and at least one subsequent chiplet coupled to the first semiconductive device, wherein the at least one subsequent chiplet is on the first semiconductive device at the active surface.

In Example 4, the subject matter of any one or more of Examples 1-3 optionally include at least one first chiplet coupled to the first semiconductive device, wherein the at least one first chiplet is on the first semiconductive device at an active surface; at least one subsequent chiplet coupled to the first semiconductive device, wherein the at least one subsequent chiplet is on the first semiconductive device at the active surface; and at least one heat slug on the first semiconductive device active surface.

In Example 5, the subject matter of any one or more of Examples 1-4 optionally include at least one first chiplet coupled to the subsequent semiconductive device, wherein the at least one first chiplet is on the subsequent semiconductive device at an active surface; and at least one subsequent chiplet coupled to the subsequent semiconductive device, wherein the at least one subsequent chiplet is on the subsequent semiconductive device at the active surface.

In Example 6, the subject matter of any one or more of Examples 1-5 optionally include at least one first chiplet coupled to the subsequent semiconductive device, wherein the at least one first chiplet is on the subsequent semiconductive device at an active surface; at least one subsequent chiplet coupled to the subsequent semiconductive device, wherein the at least one subsequent chiplet is on the subsequent semiconductive device at the active surface; at least one heat slug on the subsequent semiconductive device active surface.

In Example 7, the subject matter of any one or more of Examples 1-6 optionally include at least one first chiplet, coupled to the first semiconductive device, wherein the at least one first chiplet is on the first semiconductive device at an active surface; and at least one subsequent chiplet coupled to the subsequent semiconductive device, wherein the at least one subsequent chiplet is on the subsequent semiconductive device at an active surface.

In Example 8, the subject matter of any one or more of Examples 1-7 optionally include wherein the first semiconductive device substrate bond pad, contacts a solder film, which contacts a die-level via, which contacts a second-level via, and which contacts one of the at least one TGVs.

In Example 9, the subject matter of any one or more of Examples 1-8 optionally include percent of the glass-substrate Z-height.

In Example 10, the subject matter of any one or more of Examples 1-9 optionally include wherein the EMIB is embedded in a through-hole in the glass substrate.

In Example 11, the subject matter of any one or more of Examples 1-10 optionally include wherein the EMIB is embedded in a recess in the glass substrate.

In Example 12, the subject matter of any one or more of Examples 1-11 optionally include a semiconductor package substrate bonded to the at least one TGV.

In Example 13, the subject matter of any one or more of Examples 1-12 optionally include a semiconductor package substrate bonded to the at least one TGV; and a printed wiring board bonded to the semiconductor package substrate.

In Example 14, the subject matter of any one or more of Examples 1-13 optionally include a semiconductor package substrate bonded to the at least one TGV; a printed wiring board bonded to the semiconductor package substrate; at least one first chiplet coupled to the first semiconductive device, wherein the at least one first chiplet is on the first semiconductive device at an active surface; and at least one first chiplet coupled to the subsequent semiconductive device, wherein the at least one first chiplet is on the subsequent semiconductive device at the active surface.

In Example 15, the subject matter of any one or more of Examples 1-14 optionally include a semiconductor package substrate bonded to the at least one TGV; a printed wiring board bonded to the semiconductor package substrate; a first chiplet coupled to the first semiconductive device, wherein first chiplet is on the first semiconductive device at an active surface; a subsequent chiplet coupled to the first semiconductive device, wherein the subsequent chiplet is on the first semiconductive device at the active surface; a first chiplet coupled to the subsequent semiconductive device, wherein the first chiplet is on the subsequent semiconductive device at an active surface; and a subsequent chiplet coupled to the subsequent semiconductive device, wherein the subsequent chiplet is on the subsequent semiconductive device at the active surface.

Example 16 is a modular die in a semiconductor device package, comprising: an at least partially embedded multi-die interconnect bridge (EMIB) in a glass substrate, wherein the glass substrate includes a die side and a land side; a plurality of through-glass vias (TGVs) that communicate from the die side to the land side; a first semiconductive device coupled to the EMIB and to at least one TGV, wherein the first semiconductive device includes substrate bond pads that couple to the at least one TGV, and EMIB bond pads that couple to the EMIB; a subsequent semiconductive device coupled to the EMIB and to at least one TGV, wherein the subsequent semiconductive device includes substrate bond pads that couple to the at least one TGV, and EMIB bond pads that couple to the EMIB; a semiconductor package substrate bonded to the TGVs, wherein the first semiconductive device and the subsequent semiconductive device are electrically coupled to the semiconductor package substrate; at least one first chiplet coupled to the first semiconductive device, wherein the at least one first chiplet is on the first semiconductive device at an active surface; and at least one first chiplet coupled to the subsequent semiconductive device, wherein the at least one first chiplet is on the subsequent semiconductive device at an active surface.

In Example 17, the subject matter of Example 16 optionally includes a printed wiring board bonded to the semiconductor package substrate; at least one heat slug on the first semiconductive device active surface; and at least one heat slug on the subsequent semiconductive device active surface.

In Example 18, the subject matter of any one or more of Examples 16-17 optionally include a printed wiring board bonded to the semiconductor package substrate; an external shell that is part of the printed wiring board, wherein the external shell is an outer surface of a hand-held computing system; at, least, one heat slug on the first semiconductive device active surface; and at least one heat slug on the subsequent semiconductive device active surface.

In Example 19, the subject matter of any one or more of Examples 16-18 optionally include wherein the first semiconductive device is part of a chipset.

Example 20 is a method of assembling a modular die, comprising: filling a plated through-hole in a glass substrate; seating a bridge die in an opening in the glass substrate; and connecting a first die and a subsequent die to the bridge die, above the glass substrate.

In Example 21, the subject matter of Example 20 optionally includes assembling a chiplet to the first die and coupling the chiplet to the first die by a through-silicon via.

In Example 22, the subject matter of any one or more of Examples 20-21 optionally include wherein seating the bridge die includes seating bridge die in a through-hole opening in the glass substrate.

In Example 23, the subject matter of any one or more of Examples 20-22 optionally include wherein seating the bridge die includes seating bridge die in a recess opening in the glass substrate.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B"

includes "A but not B," "B but not A," and "A and 13," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that, such embodiments can be combined with each other in various combinations or permutations. The scope of the disclosed embodiments should be determined with reference to the appended claims, along with the full scope of equivalents to which such claims are entitled.

The invention claimed is:

1. A modular semiconductive device, comprising:
   an at least partially embedded multi-die interconnect bridge (EMIB) in an opening in a glass substrate, wherein the glass substrate includes a die side and a land side, and wherein the glass substrate is an inorganic substrate;
   a dielectric film over the glass substrate, over the EMIB, and in the opening in the glass substrate;
   a plurality of through-glass vias (TGVs) that communicate from the die side to the land side;
   a first semiconductive device coupled to the EMIB and to a first TGV of the plurality of TGVs, wherein the first semiconductive device includes substrate bond pads that couple to the first TGV, and EMIB bond pads that couple to the EMIB, wherein the first semiconductive device has an active surface, the active surface facing away from the EMIB; and
   a subsequent semiconductive device coupled to the EMIB and to a second TGV of the plurality of TGVs, wherein the subsequent semiconductive device includes substrate bond pads that couple to the second TGV, and EMIB bond pads that couple to the EMIB.

2. The modular semiconductive device of claim 1, further including at least one first chiplet coupled to the first semiconductive device, wherein the at least one first chiplet is on the first semiconductive device at the active surface.

3. The modular semiconductive device of claim 1, further including:
   at least one first chiplet coupled to the first semiconductive device, wherein the at least one first chiplet is on the first semiconductive device at the active surface; and
   at least one subsequent chiplet coupled to the first semiconductive device, wherein the at least one subsequent chiplet is on the first semiconductive device at the active surface.

4. The modular semiconductive device of claim 1, further including:
   at least one first chiplet coupled to the first semiconductive device, wherein the at least one first chiplet is on the first semiconductive device at the active surface;
   at least one subsequent chiplet coupled to the first semiconductive device, wherein the at least one subsequent chiplet is on the first semiconductive device at the active surface; and
   at least one heat slug on the first semiconductive device active surface.

5. The modular semiconductive device of claim 1, further including:
   at least one first chiplet coupled to the subsequent semiconductive device, wherein the at least one first chiplet is on the subsequent semiconductive device at an active surface of the subsequent semiconductive device; and
   at least one subsequent chiplet coupled to the subsequent semiconductive device, wherein the at least one subsequent chiplet is on the subsequent semiconductive device at the active surface.

6. The modular semiconductive device of claim 1, further including:
   at least one first chiplet coupled to the subsequent semiconductive device, wherein the at least one first chiplet is on the subsequent semiconductive device at an active surface of the subsequent semiconductive device;
   at least one subsequent chiplet coupled to the subsequent semiconductive device, wherein the at least one subsequent chiplet is on the subsequent semiconductive device at the active surface;
   at least one heat slug on the subsequent semiconductive device active surface.

7. The modular semiconductive device of claim 1, further including:
   at least one first chiplet coupled to the first semiconductive device, wherein the at least one first chiplet is on the first semiconductive device at the active surface; and
   at least one subsequent chiplet coupled to the subsequent semiconductive device, wherein the at least one subsequent chiplet is on the subsequent semiconductive device at an active surface.

8. The modular semiconductive device of claim 1, wherein the first semiconductive device substrate bond pad, contacts a solder film, which contacts a die-level via, which contacts a second-level via, and which contacts one of the first or second TGVs.

9. The modular semiconductive device of claim 1, wherein the glass substrate has a Z-height, and wherein the EMIB has a Z-height that is within 96 percent of the glass-substrate Z-height.

10. The modular semiconductive device of claim 1, wherein the EMIB is embedded in a through-hole in the glass substrate.

11. The modular semiconductive device of claim 1, wherein the EMIB is embedded in a recess in the glass substrate.

12. The modular semiconductive device of claim 1, further including a semiconductor package substrate bonded to the first or second TGV.

13. The modular semiconductive device of claim 1, further including:
a semiconductor package substrate bonded to the first or second TGV; and
a printed wiring board bonded to the semiconductor package substrate.

14. The modular semiconductive device of claim 1, further including:
a semiconductor package substrate bonded to at least one TGV of the plurality of TGVs;
a printed wiring board bonded to the semiconductor package substrate;
at least one first chiplet coupled to the first semiconductive device, wherein the at least one first chiplet is on the first semiconductive device at the active surface; and
at least one second chiplet coupled to the subsequent semiconductive device, wherein the at least one second chiplet is on the subsequent semiconductive device at the active surface.

15. The modular semiconductive device of claim 1, further including:
a semiconductor package substrate bonded to the first or second TGV;
a printed wiring board bonded to the semiconductor package substrate;
a first chiplet coupled to the first semiconductive device, wherein first chiplet is on the first semiconductive device at the active surface;
a first subsequent chiplet coupled to the first semiconductive device, wherein the first subsequent chiplet is on the first semiconductive device at the active surface;
a second chiplet coupled to the subsequent semiconductive device, wherein the second chiplet is on the subsequent semiconductive device at an active surface; and
a second subsequent chiplet coupled to the subsequent semiconductive device, wherein the second subsequent chiplet is on the subsequent semiconductive device at the active surface.

16. A modular die in a semiconductor device package, comprising:
an at least partially embedded multi-die interconnect bridge (EMIB) in an opening in a glass substrate, wherein the glass substrate includes a die side and a land side, and wherein the glass substrate is an inorganic substrate;
a dielectric film over the glass substrate, over the EMIB, and in the opening in the glass substrate;
a plurality of through-glass vias (TGVs) that communicate from the die side to the land side;
a first semiconductive device coupled to the EMIB and to a first TGV of the plurality of TGVs, wherein the first semiconductive device includes substrate bond pads that couple to the first TGV, and EMIB bond pads that couple to the EMIB, wherein the first semiconductive device has an active surface, the active surface facing away from the EMIB;
a subsequent semiconductive device coupled to the EMIB and to a second TGV of the plurality of TGVs, wherein the subsequent semiconductive device includes substrate bond pads that couple to the second TGV, and EMIB bond pads that couple to the EMIB;
a semiconductor package substrate bonded to the TGVs, wherein the first semiconductive device and the subsequent semiconductive device are electrically coupled to the semiconductor package substrate;
at least one first chiplet coupled to the first semiconductive device, wherein the at least one first chiplet is on the first semiconductive device at the active surface; and
at least one second chiplet coupled to the subsequent semiconductive device, wherein the at least one second chiplet is on the subsequent semiconductive device at an active surface.

17. The modular die of claim 16, further including:
a printed wiring board bonded to the semiconductor package substrate;
at least one heat slug on the first semiconductive device active surface; and
at least one heat slug on the subsequent semiconductive device active surface.

18. The modular die of claim 16, further including:
a printed wiring board bonded to the semiconductor package substrate;
an external shell that is part of the printed wiring board, wherein the external shell is an outer surface of a hand-held computing system;
at least one heat slug on the first semiconductive device active surface; and
at least one heat slug on the subsequent semiconductive device active surface.

19. The modular die of claim 16, wherein the first semiconductive device is part of a chipset.

* * * * *